(12) United States Patent
Sommer et al.

(10) Patent No.: US 6,770,928 B2
(45) Date of Patent: Aug. 3, 2004

(54) SEMICONDUCTOR MEMORY WITH VERTICAL SELECTION TRANSISTOR

(75) Inventors: Michael Sommer, Raubling (DE); Gerhard Enders, Olching (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/375,763

(22) Filed: Feb. 26, 2003

(65) Prior Publication Data

US 2003/0161201 A1 Aug. 28, 2003

(30) Foreign Application Priority Data

Feb. 26, 2002 (DE) .......................................... 102 08 249

(51) Int. Cl.[7] .......................................... H01L 27/108
(52) U.S. Cl. ....................... 257/301; 257/302; 257/304; 257/296; 257/300; 257/305; 438/243; 438/246; 438/248; 438/270
(58) Field of Search ................................. 257/301, 302, 257/304, 296, 300, 305; 438/243, 246, 248, 270

(56) References Cited

U.S. PATENT DOCUMENTS

| 6,063,658 | A | * | 5/2000 | Horak et al. ................. 438/248 |
| 6,200,851 | B1 | * | 3/2001 | Arnold ........................ 438/243 |
| 6,200,873 | B1 | * | 3/2001 | Schrems et al. ............. 438/386 |
| 6,204,140 | B1 | * | 3/2001 | Gruening et al. ........... 438/386 |
| 6,262,448 | B1 | | 7/2001 | Enders et al. |
| 6,399,435 | B1 | * | 6/2002 | Tihanyi ....................... 438/248 |
| 6,448,600 | B1 | | 9/2002 | Schlösser et al. |

FOREIGN PATENT DOCUMENTS

DE 199954867 C1 12/2000
EP 0282716 A1 * 9/1988

* cited by examiner

*Primary Examiner*—Nathan J. Flynn
*Assistant Examiner*—Remmon R. Fordé
(74) *Attorney, Agent, or Firm*—Laurence A. Greenberg; Werner H. Stemer; Gregory L. Mayback

(57) ABSTRACT

A semiconductor memory having memory cells, each memory cell includes a selection transistor and a trench capacitor. The selection transistor is formed in the form of a vertical transistor. In such a case, two word lines are separated only by a connecting channel that enables an electrically conductive connection between a trench filling of the trench capacitor and a bit line.

20 Claims, 8 Drawing Sheets

SEMICONDUCTOR MEMORY WITH VERTICAL SELECTION TRANSISTOR

BACKGROUND OF THE INVENTION

1. Field of the Invention

The invention relates to a semiconductor memory.

Semiconductor memories have memory cells to store an item of information in the form of a charge. A memory cell of a DRAM semiconductor memory has, by way of example, a trench capacitor and a selection transistor. A charge is stored in the trench capacitor in accordance with the information to be stored, the charge being transferred, through a driving of the selection transistor, through a word line to a bit line of the semiconductor memory. An evaluation circuit evaluates the voltage of the bit line so that the charge stored in the trench capacitor can be detected as information.

In order, as structures become ever smaller, to be able to realize a DRAM memory cell, for example, on the available space, concepts with a vertically disposed selection transistor are increasingly being investigated.

German Patent DE 199 54 867 C1, corresponding to U.S. Pat. No. 6,448,600 to Schloesser et al., discloses a DRAM cell configuration and a method for fabricating it in which a vertical selection transistor is provided. The known cell configuration has a trench capacitor that, in an upper end region, is connected to a horizontally disposed source-drain region. A lower source-drain region is formed in a manner offset with respect to the upper source-drain region and is connected to a vertical connecting channel. The connecting channel is led from the lower source-drain region upward to the bit line. A gate region constituting part of a word line is formed parallel to the connecting channel.

The known cell configuration has the disadvantage that a relatively large amount of area is required to form the memory cell.

SUMMARY OF THE INVENTION

It is accordingly an object of the invention to provide a semiconductor memory with vertical selection transistor that overcomes the hereinafore-mentioned disadvantages of the heretofore-known devices of this general type and that has a memory cell with a smaller area requirement.

With the foregoing and other objects in view, there is provided, in accordance with the invention, a semiconductor memory, including at least one memory cell defining a trench having a lower part, the at least one memory cell having a trench capacitor formed in the lower part of the trench, the trench capacitor having a trench filling serving as a first electrode, a second electrode disposed outside the trench, and a dielectric layer electrically insulating the first electrode from the second electrode, a bit line disposed above the trench capacitor, and a vertically formed selection transistor having a perpendicular connecting channel forming therethrough an electrically conductive connection between the first electrode of the trench capacitor and the bit line, the connecting channel being formed laterally adjoining the trench, at least one word line associated with the at least one memory cell, the connecting channel being led upward in a direction of the bit line through the at least one word line, and a gate region of the selection transistor being formed laterally adjoining the connecting channel and above the trench filling as the first electrode. The vertically formed selection transistor can have a vertical connecting channel forming therethrough the electrically conductive connection between the first electrode of the trench capacitor and the bit line.

One advantage of the semiconductor memory according to the invention is that the connecting channel is formed in a manner laterally adjoining the trench filling of the trench capacitor, and that a gate region of the selection transistor is formed in a manner laterally adjoining the connecting channel and above the trench filling and the connecting channel constitutes an active region of the selection transistor. As such, less area is required to form the memory cell.

In accordance with another feature of the invention, the gate region surrounds the connecting channel. An improved activation of the active region of the connecting channel is made possible in this way. Moreover, a larger conduction channel that forms is achieved overall.

In accordance with a further feature of the invention, the gate region surrounds the connecting channel and is formed as part of the at least one word line.

In accordance with an added feature of the invention, the trench filling is covered by an insulation layer that is led with an over-area beyond a side edge of the trench filling. What is achieved in this way is that the trench filling, on the side of the over-area, is protected against the formation of a parasitic current. The formation of the over-area prevents the trench filling, on the side of the over-area, from forming a current to a connecting channel that adjoins the trench filling on the side. A crosstalk to an adjacent connecting channel that leads to an adjacent bit line is, thus, avoided.

In accordance with an additional feature of the invention, the trench has a side edge and an insulation layer covers the trench and has an over-area extending beyond the side edge of the trench.

A further reduction of the area required for forming the memory cell is achieved by virtue of the fact that at least one part of a second word line is disposed on the over-area above the trench filling. Consequently, the available area above the trench filling can be used for disposing both a first word line and a second word line. The first word line is used for driving the trench filling. The second word line is provided for driving an adjacent trench filling.

In accordance with yet another feature of the invention, there is provided a substantially vertical insulation layer isolating the second word line from the at least one word line and at least one part of the at least one word line and at least one part of the second word line being disposed above the trench. Preferably, a vertical insulation layer substantially isolates the first and second word lines. As a result, first, a simple fabrication method is made possible and, second, a large-area activation of the connecting channel by the word lines is achieved.

In accordance with yet a further feature of the invention, the at least one memory cell and the at least one word line are formed by lithography having a minimum resolution width and the insulation layer has a width less than the minimum resolution width.

In accordance with yet an added feature of the invention, the width of the insulation layer is less than the minimum resolution width F of the lithography used. This small width is achieved by virtue of the fact that, during the fabrication of the insulation layer, by way of example, a spacer technique is used to further reduce the minimum resolution.

In accordance with a concomitant feature of the invention, the at least one memory cell is a plurality of memory cells with a plurality of bit lines, the at least one word line is a plurality of word lines, the word lines are disposed substantially parallel to one another, the bit lines are disposed substantially parallel to one another, the word lines and the bit lines are substantially perpendicular to one another, the trench capacitors of the memory cells are disposed laterally offset with respect to one another from one of the bit lines to another of the bit lines, and the selection transistors of the memory cells for adjacent ones of the bit lines are disposed on opposite sides of a respective one of the trench capacitors.

Other features that are considered as characteristic for the invention are set forth in the appended claims.

Although the invention is illustrated and described herein as embodied in a semiconductor memory with vertical selection transistor, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
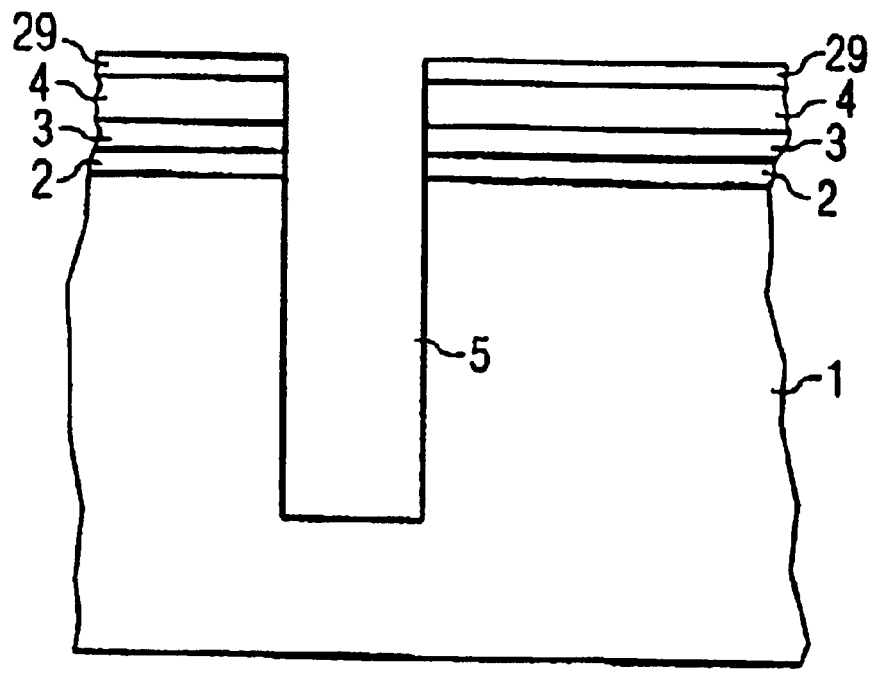
FIG. 1 is a fragmentary, cross-sectional view of a first method status for producing a memory according to the invention.

Referring now to the figures of the drawings in detail and first, particularly to FIG. 1 thereof, for the fabrication of the semiconductor memory, use is made of a positively doped silicon wafer 1, to which a trench etching mask is applied. The trench etching mask includes a first mask layer 2 formed in the form of a thermal oxide layer. The thermal oxide layer 2 has a thickness of approximately 5 nm. A second mask layer 3, preferably formed in the form of a nitride layer, is applied on the first mask layer. The second mask layer 3 has a thickness of approximately 200 nm. Afterward, a third mask layer 4 is applied to the second mask layer 3, the third mask layer 4 being formed in the form of a CVD oxide layer (e.g., borosilicate glass) and, preferably, having a thickness of approximately 1,000 nm. Afterward, a photoresist 29 is applied to the third mask layer 4 by a lithography process. The photoresist layer 29 is patterned according to known methods. In such a case, areas that substantially correspond to the cross-sectional area of a trench 5 are etched out from the photoresist. Afterward, both the trench etching mask and the silicon wafer are etched in a predetermined thickness. In such a case, a trench 5 is introduced into the silicon wafer 1. This method status is illustrated in FIG. 1.

Figure 2:
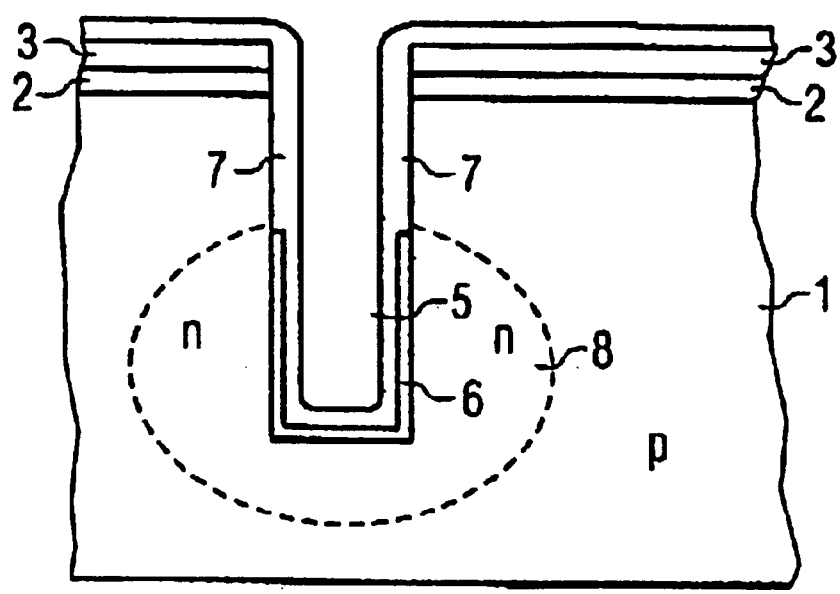
FIG. 2 is a fragmentary, cross-sectional view of a second method status for producing a memory according to the invention.

Afterward, the photoresist and the third mask layer 4 are removed. An arsenic-doped oxide layer 6 is, thereupon, deposited on the areas of the trench 5 by a chemical vapor deposition method. Afterward, the arsenic-doped layer 6 is removed again from the upper region of the trench 5 down to a first depth. In addition, a second oxide layer 7 is deposited both onto the arsenic layer 6 and onto the uncovered upper side areas of the trench 5 by a CVD method. Afterward, an n-doped region or layer 8, constituting a counter-electrode of the trench capacitor 9, is formed by a process of outdiffusion from the arsenic layer 6 into the regions of the p-doped silicon wafer 1 that adjoin the arsenic layer 6. The n-doped region 8 forms a buried layer in the silicon wafer 1. This method status is illustrated in FIG. 2.

Figure 3:
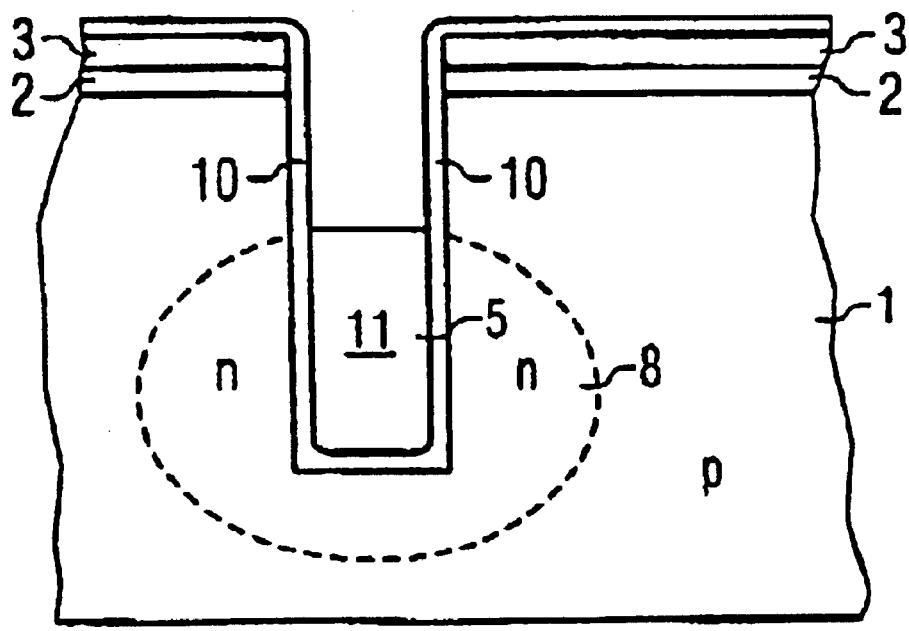
FIG. 3 is a fragmentary, cross-sectional view of a third method status for producing a memory according to the invention.

Afterward, both the second oxide layer 7 and the arsenic layer 6 are removed again. Consequently, a silicon wafer 1 with a trench 5 that has an n-doped buried layer 8 in a lower region is, now, present. The walls of the trench 5 are covered with a dielectric layer 10, preferably, a nitride-oxide layer. The dielectric layer 10, preferably, has a thickness of 5 nm oxide equivalent. A first polysilicon layer 11 or polylayer, which is n-doped, is, thereupon, introduced into the lower region of the trench 5. In such a case, preferably, the entire trench 5 is filled and then etched back again down to the first depth. This method status is illustrated in FIG. 3.

Figure 4:
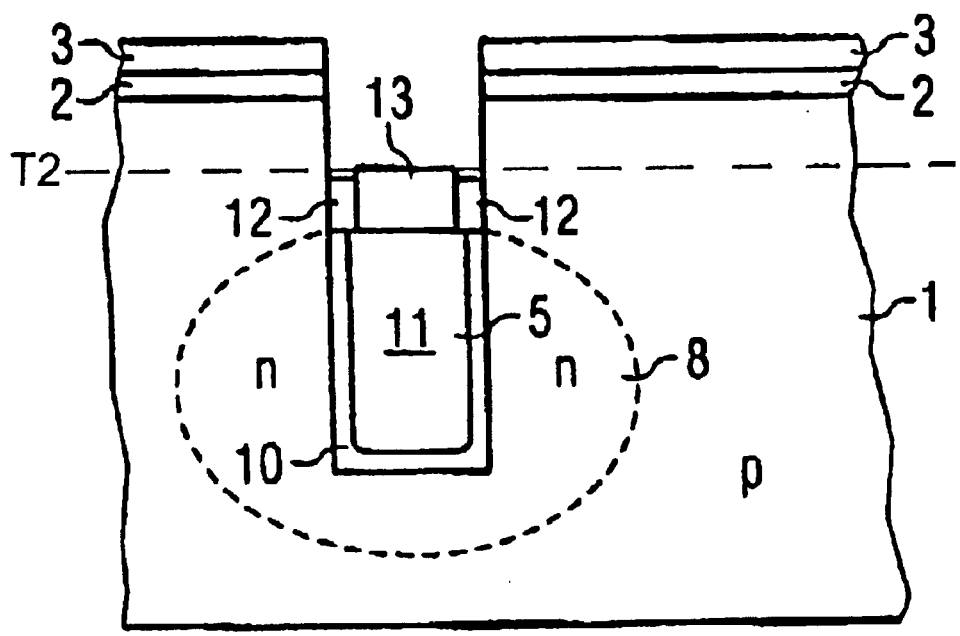
FIG. 4 is a fragmentary, cross-sectional view of a fourth method status for producing a memory according to the invention.

Afterward, the dielectric layer 10 is removed again from the upper region of the trench, i.e., above the polysilicon layer 11, from the side walls of the trench 5. A collar layer 12, preferably including a silicon oxide deposited by a CVD method, is, subsequently, applied to the side walls of the trench 5. The collar layer 12 is, thereupon, etched back anisotropically. A second polysilicon layer 13, or polylayer, is, thereupon, deposited into the trench 5. The second polysilicon layer 13 is, thereupon, etched back down to a second depth T2. The collar layer 12 is, thereupon, removed in the upper region and removed laterally down to the upper edge of the second polysilicon layer 13. This method situation is illustrated in FIG. 4.

Figure 5:
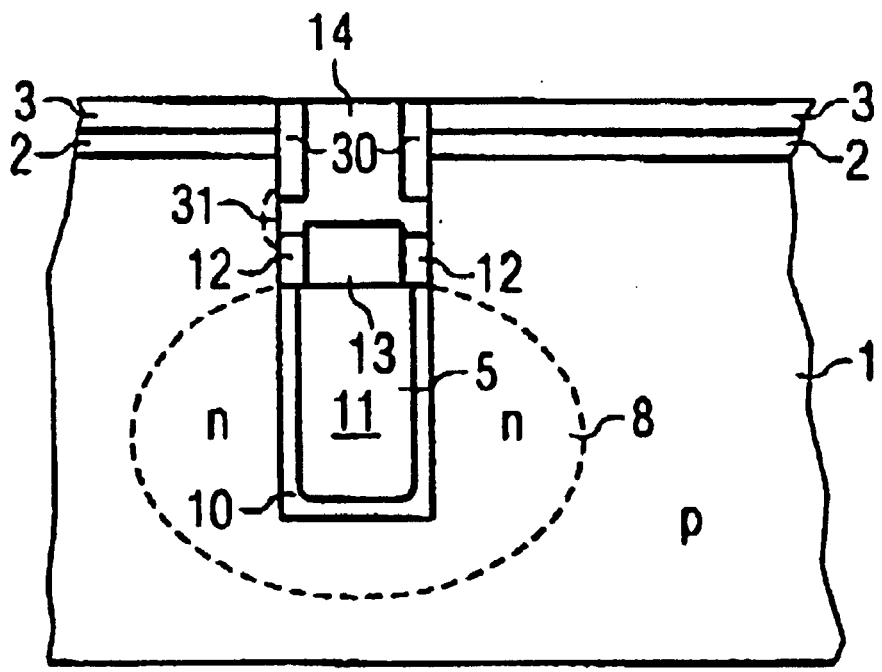
FIG. 5 is a fragmentary, cross-sectional view of a fifth method status for producing a memory according to the invention.
Figure 6:
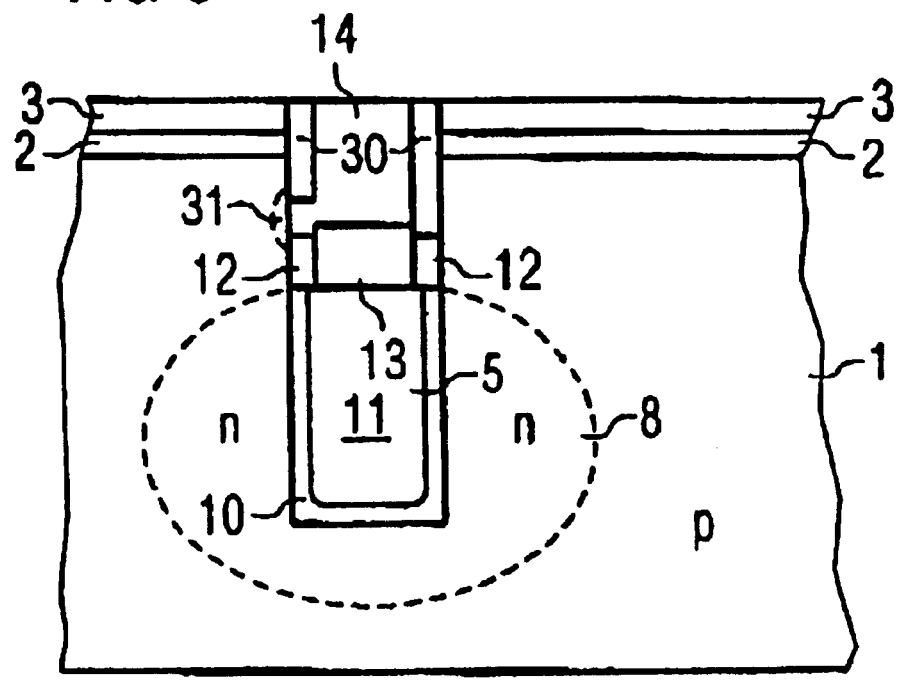
FIG. 6 is a fragmentary, cross-sectional view of a sixth method status for producing a memory according to the invention.
Figure 7:
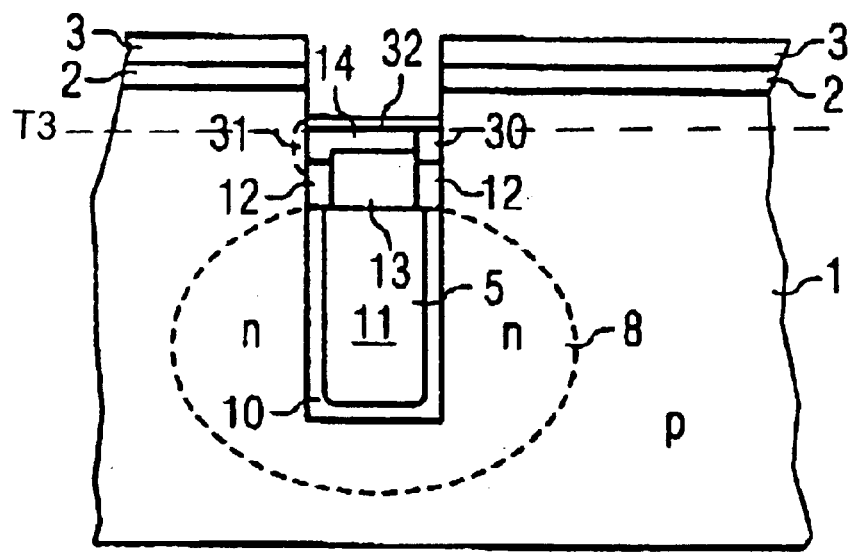
FIG. 7 is a fragmentary, cross-sectional view of a seventh method status for producing a memory according to the invention.

Afterward, a buried strap is produced in a manner adjoining the upper edge of the second polylayer 13, preferably, only on one side. To that end, a third polysilicon layer 14 is deposited in a manner adjoining the second polylayer 13 only up to a defined height proceeding from the second polylayer 13. To that end, a covering layer 30 masks the side areas of the trench 5 that lie above the defined height. The covering layer 30 is formed as a nitrite layer, for example. Afterward, in an outdiffusion process, an n-doped buried strap region 31 is produced in the silicon wafer 1. This method status is illustrated in FIG. 5. A buried strap region 31 is, preferably, produced only on one side of the trench 5. To that end, by way of example, the covering layer 30 on the right-hand side is taken as far as the collar layer 12, as is illustrated in FIG. 6. The third polysilicon layer 14 is, thereupon, etched back to a third depth T3 and the covering layer 30 is removed above the third polysilicon layer 14. Afterward, a top oxide layer 32 is applied to the third polysilicon layer 14 by a TTO method. In such a case, only the top side of the third polysilicon layer 14 is covered; the side walls of the trench 5 are not covered. This method status is illustrated in FIG. 7.

Figure 8:
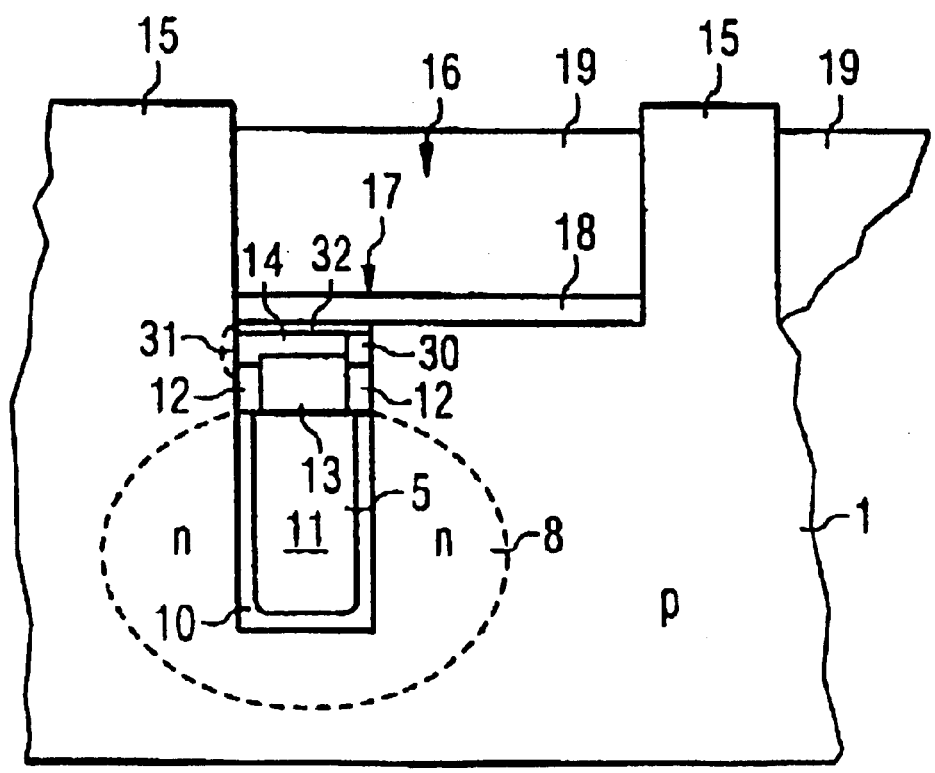
FIG. 8 is a fragmentary, cross-sectional view of an eighth method status for producing a memory according to the invention.

Afterward, connecting channels 15 are patterned from the silicon wafer 1 by lithographic methods. At least one connecting channel 15 is, preferably, formed in a manner directly adjoining a side area of the third polysilicon layer 14. The distances between two connecting channels 15 are greater than the width of the trench 5. Two connecting channels 15 are spaced apart from one another by a recess 16. A covering layer 17 formed in the form of an insulation layer is introduced into a base area of the recess. In the illustration of FIG. 8, the covering layer 17 projects beyond the side of the trench 5 in the right-hand region. That region of the covering area 17 that projects laterally beyond the trench 5 is referred to as over-area 18. The side walls of the recess 16 are, subsequently, covered with a gate oxide layer 33. The recesses 16 are, thereupon, filled with a gate layer 19, such as, e.g., an n-doped polysilicon, and ground plane with the upper edge of the silicon wafer 1. In such a case, the first and second mask layers 2, 3 are also removed. Afterward, the gate material 19 is etched back below the upper edge of the connecting channels 15 by an etching-back process. This method status is illustrated in FIG. 8.

Figure 9:
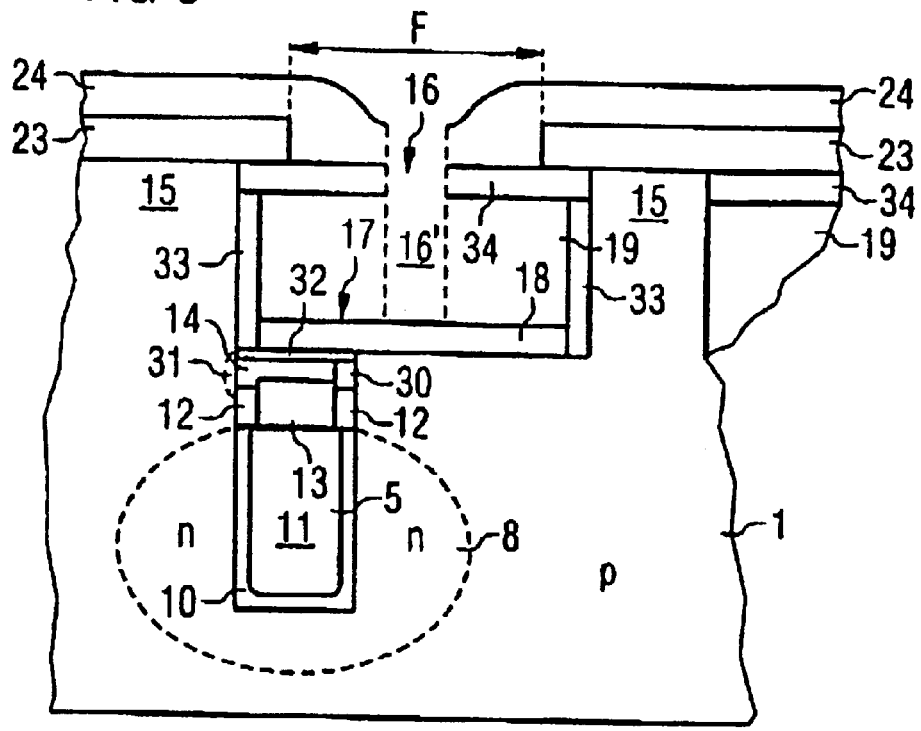
FIG. 9 is a fragmentary, cross-sectional view of a ninth method status for producing a memory according to the invention.

Depending on the embodiment, a doping of the connecting channels 15 can be performed during this method status. To that end, the connecting channels 15 are, preferably, provided with the desired doping by an ion implantation and a subsequent diffusion process. The gate layer 19 is, thereupon, covered with a covering oxide layer 34. The gate material 19 is patterned in a subsequent method step, a gate material 19 disposed in a recess 16 being subdivided into two gate regions 21, 22 by an intermediate layer 20. In such a case, a spacer technique is, preferably, used to bring the width of the intermediate layer 20 to below the resolution limit of 1F. To that end, a second covering mask 23 having elevated structures with a spacing of 1F is applied to the surface of the silicon wafer. Afterward, a third covering structure 24 is deposited onto the second covering mask 23 by the known spacer technique. During a subsequent anisotropic etching method, the third covering structure 24 is etched away down to the upper edge of the silicon wafer 1. On account of the structure of the third covering structure 24, an opening is obtained that has a smaller width than the smallest resolution 1F of the lithography process used. Afterward, a recess 16' is etched into the gate layer 19 through the patterned covering structure 24 down to the over-area 18. This method status is illustrated in FIG. 9.

The recess 16' is, subsequently, filled with the intermediate layer 20. The intermediate layer 20 includes a silicon oxide, for example, and separates a first and a second gate region 21, 22. The second covering mask 23 and the third covering structure 24 are, thereupon, removed. The first and second gate regions 21, 22 are each part of a word line.

Figure 10:
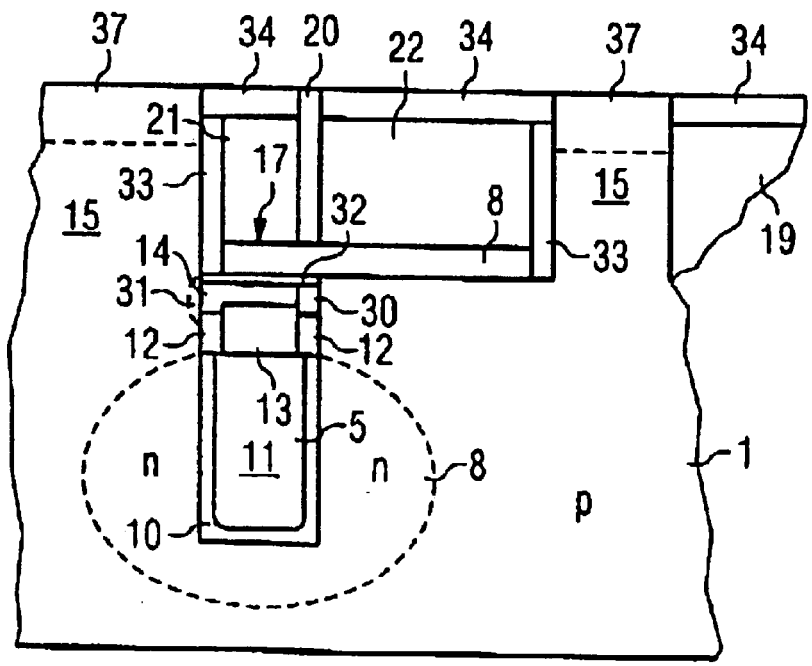
FIG. 10 is a fragmentary, cross-sectional view of a tenth method status for producing a memory according to the invention.

Furthermore, the connecting channels 15 are masked by a covering mask and an n-doped region is implanted into the upper region of the connecting channels 15, the n-doped region constituting a bit line doping 37, as illustrated in FIG. 10. Afterward, a bit line contact is etched and bit line material is deposited, which is patterned in accordance with the desired form of the bit lines 26.

Figure 11:
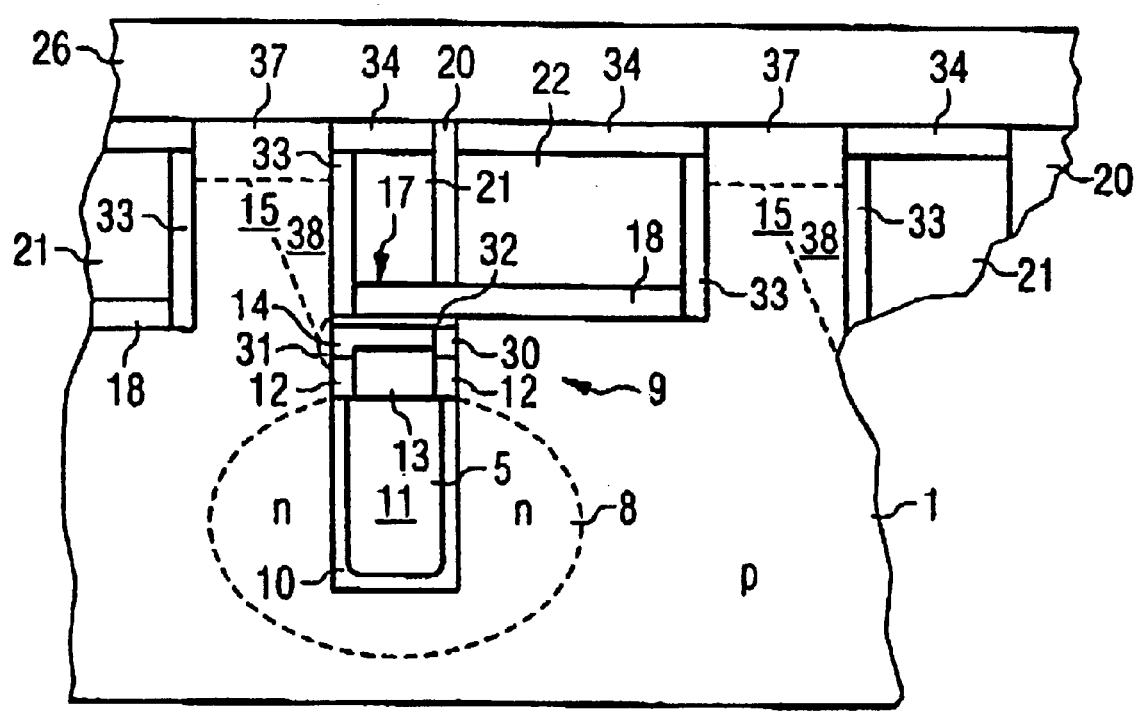
FIG. 11 is a cross-sectional view through the semiconductor memory according to the invention.

FIG. 11 shows a cross-section through a first embodiment of a memory cell of a DRAM semiconductor memory module. The first gate region 21, the buried strap 31, and the bit line doping 37 form a selection transistor. If a voltage is applied to the first gate region 21, then a conduction channel 38 is formed between the buried strap 31 and the bit line doping 37. As a result, the inner electrode of the trench capacitor 9 is conductively connected to the bit line 26. If the voltage is switched off, then the conductive connection is interrupted. The first gate region 21 is part of a first word line 27 (FIG. 12) and the second gate region 22 is part of a second word line 28 (FIG. 12).

Figure 12:
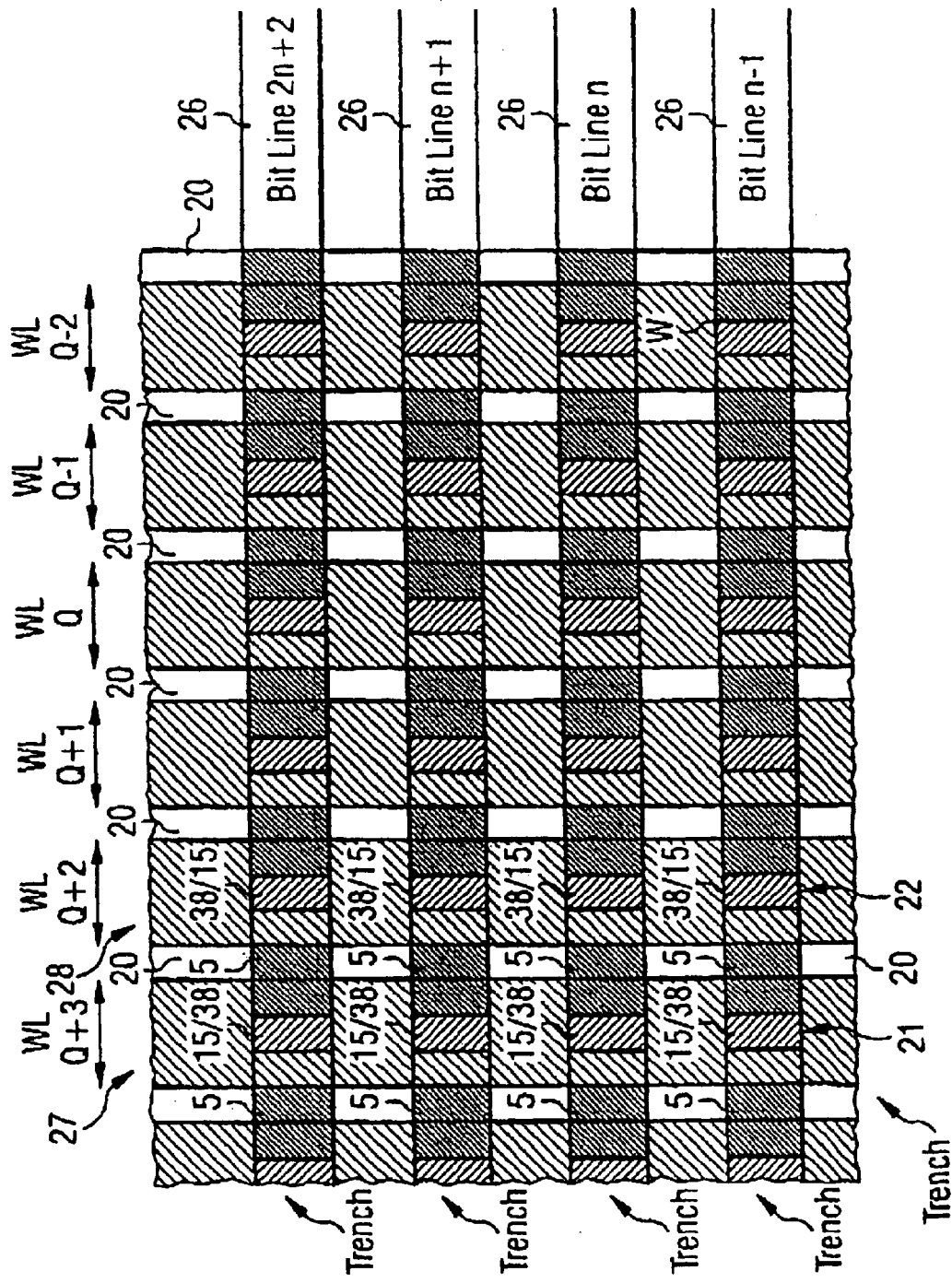
FIG. 12 is a fragmentary plan view of a detail from a DRAM memory module with a first cell geometry according to the invention.

FIG. 12 illustrates a plan view of the structure of a detail from a DRAM memory module. The configuration of the trenches 5, of the bit lines 26, of the word lines 27, 28 and of the connecting channels 15 and conduction channels 38 is clearly discernable in this case. The bit lines 26 are disposed parallel to one another and at right angles to the word lines 27, 28. The word lines 27, 28 are, likewise, disposed parallel to one another. Two word lines 27, 28 are respectively insulated from one another by an intermediate layer 20.

FIG. 12 reveals that both a part of a first word line 27 that forms the first gate region 21 and a part of a second word line 28 that forms the second gate region 22 are disposed on the covering area 17. Close packing of the first and second word lines 27, 28 is, thus, achieved overall.

The first and second word lines 27, 28 and the intermediate layer 20 are, preferably, formed such that a word line is in each case formed in a manner adjoining a side region of a trench 5 and is taken laterally as far as a region that still partly covers an adjacent trench 5. A residual area of the adjacent trench 5 is covered by the intermediate layer 20 that separates the first and second word lines. In the event of the first or second word line being driven, conduction channels 38 form, through which charge can be exchanged between the bit line 26 and the trench capacitor 9.

Figure 13:
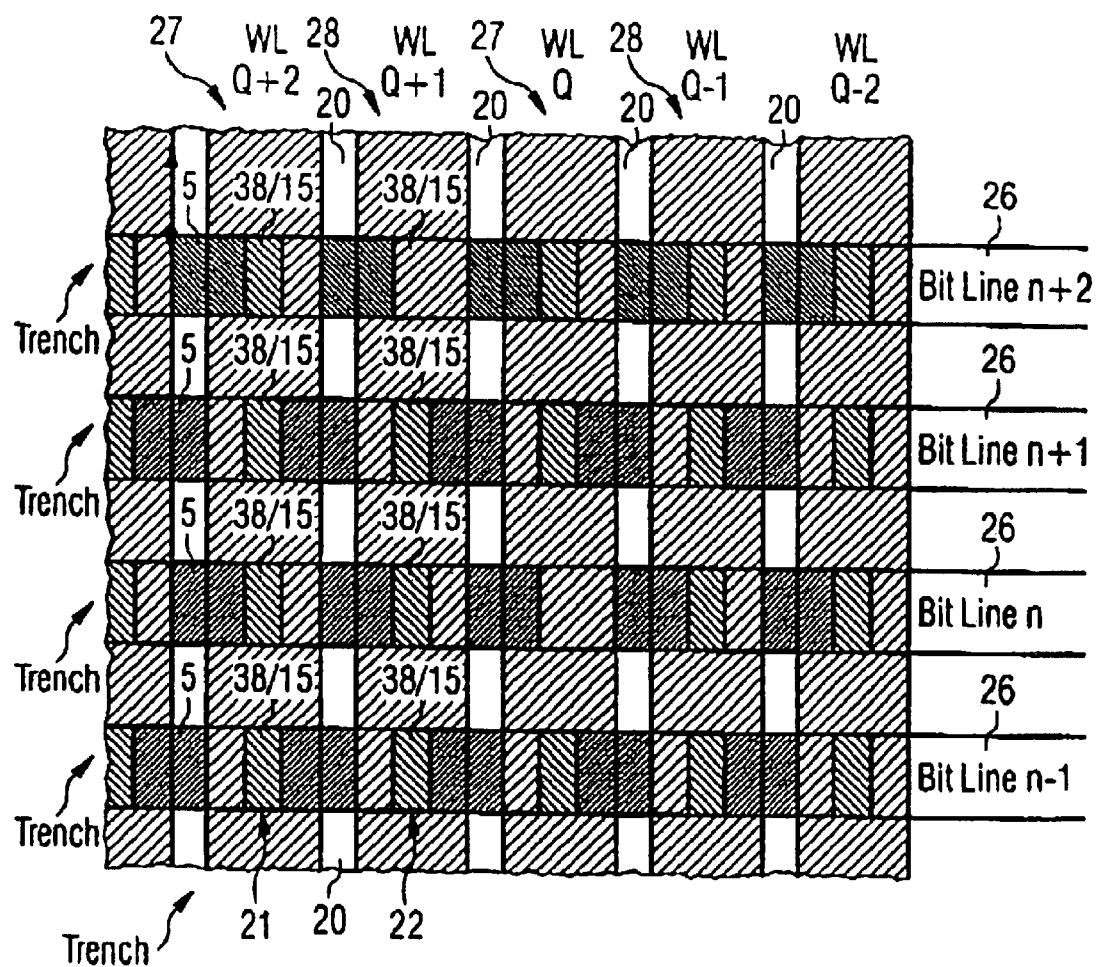
FIG. 13 is a fragmentary plan view of a detail from a DRAM memory module with a second cell geometry according to the invention.

FIG. 13 shows a preferred embodiment in which the trench capacitors of, two adjacent bit lines 26 are in each case disposed in a manner offset laterally with respect to one another by half the width of the trench 5. Moreover, the conduction channels 38 of two adjacent bit lines are disposed at two opposite sides of the trenches 5. The offset embodiment in accordance with FIG. 13 has the advantage that lithographic methods are easier to employ. Because structures drawn in square fashion on the lithography mask are imaged in a manner rounded to a minimal extent at the corners, trenches can be moved closer together and denser packing than in the first configuration results for round trenches.

Furthermore, it is advantageous, with the aim of keeping the electrical resistance of a word line 27, 28 as small as possible, to make the width of the insulation layer 20 between two word lines 27, 28 smaller than the minimum feature size F that can be achieved lithographically. This can be achieved by the spacer technique described, for example. In such a case, the width of a narrow trench in the etching mask is reduced further in that, after a layer has been deposited conformally into the trench, the layer is etched back anisotropically and, as a result, the deposited material remains only on the walls of the trench. With the aid of the etching mask thus fabricated, it is possible to produce spacings for the word lines of far below the lithographic resolution limit F. As a result, a larger area is available for forming the word line 27, 28, the larger area, in turn, leading to a smaller electrical resistance of the word lines 27, 28.

We claim:

1. A semiconductor memory, comprising:
   at least one memory cell defining a trench having a lower part, said at least one memory cell having:
   a trench capacitor formed in said lower part of said trench, said trench capacitor having:
   a trench filling serving as a first electrode;
   a second electrode disposed outside said trench; and
   a dielectric layer electrically insulating said first electrode from said second electrode;
   a bit line disposed above said trench capacitor; and
   a vertically formed selection transistor having a vertical connecting channel forming therethrough an electrically conductive connection between said first electrode of said trench capacitor and said bit line, said connecting channel being formed laterally adjoining said trench;
   at least one word line associated with said at least one memory cell, said connecting channel being led upward in a direction of said bit line through said at least one word line; and
   a gate region of said selection transistor being formed laterally adjoining said connecting channel and above said trench filling as said first electrode.

2. The semiconductor memory according to claim 1, wherein said gate region:
   surrounds said connecting channel; and
   is formed as part of said at least one word line.

3. The semiconductor memory according to claim 2, wherein:
   said trench has a side edge; and
   an insulation layer covers said trench, said insulation layer being led with an over-area beyond said side edge of said trench.

4. The semiconductor memory according to claim 2, wherein:
   said trench has a side edge; and
   an insulation layer covers said trench and has an over-area extending beyond said side edge of said trench.

5. The semiconductor memory according to claim 3, including a second word line having at least one part disposed above and adjoining said trench.

6. The semiconductor memory according to claim 5, including;
   a substantially vertical insulation layer isolating said second word line from said at least one word line, and
   at least one part of said at least one word line and at least one part of said second word line being disposed above said trench.

7. The semiconductor memory according to claim 6, wherein said vertical insulation layer has a width less than a minimum resolution width of a lithography process used.

8. The semiconductor memory according to claim 6, wherein:
   said at least one memory cell and said at least one word line are formed by lithography having a minimum resolution width; and
   said insulation layer has a width less than said minimum resolution width.

9. The semiconductor memory according to claim 1, wherein:
   said at least one memory cell is a plurality of memory cells with a plurality of bit lines;
   said at least one word line is a plurality of word lines;
   said word lines are disposed substantially parallel to one another;
   said bit lines are disposed substantially parallel to one another;
   said word lines and said bit lines are substantially perpendicular to one another;
   said trench capacitors of said memory cells are disposed laterally offset with respect to one another from one of said bit lines to another of said bit lines; and
   said selection transistors of said memory cells for adjacent ones of said bit lines are disposed on opposite sides of a respective one of said trench capacitors.

10. The semiconductor memory according to claim 8, wherein:
    said at least one memory cell is a plurality of memory cells with a plurality of bit lines;
    said at least one word line is a plurality of word lines;
    said word lines are disposed substantially parallel to one another;
    said bit lines are disposed substantially parallel to one another;
    said word lines and said bit lines are substantially perpendicular to one another;
    said trench capacitors of said memory cells are disposed laterally offset with respect to one another from one of said bit lines to another of said bit lines; and
    said selection transistors of said memory cells for adjacent ones of said bit lines are disposed on opposite sides of a respective one of said trench capacitors.

11. A semiconductor memory, comprising:
    at least one memory cell defining a trench having a lower part, said at least one memory cell having:
    a trench capacitor formed in said lower part of said trench, said trench capacitor having:
    a trench filling serving as a first electrode;
    a second electrode disposed outside said trench; and
    a dielectric layer electrically insulating said first electrode from said second electrode;
    a bit line disposed above said trench capacitor; and
    a vertically formed selection transistor having a vertical connecting channel forming therethrough an electrically conductive connection between said first electrode of said trench capacitor and said bit line, said connecting channel being formed laterally adjoining said trench;
    a word line associated with said at least one memory cell, said connecting channel being led upward in a direction of said bit line through said word line; and
    a gate region of said selection transistor being formed laterally adjoining said connecting channel and above said trench filling as said first electrode.

12. The semiconductor memory according to claim 11, wherein said gate region:
    surrounds said connecting channel; and
    is formed as part of said one word line.

13. The semiconductor memory according to claim 12, wherein:

said trench has a side edge; and an insulation layer covers said trench, said insulation layer being led with an over-area beyond said side edge of said trench.

14. The semiconductor memory according to claim 12, wherein:

said trench has a side edge; and an insulation layer covers said trench and has an over-area extending beyond said side edge of said trench.

15. The semiconductor memory according to claim 13, including a second word line having at least one part disposed above and adjoining said trench.

16. The semiconductor memory according to claim 15, including;

a substantially vertical insulation layer isolating said second word line from said word line; and at least one part of said word line and at least one part of said second word line being disposed above said trench.

17. The semiconductor memory according to claim 16, wherein said vertical insulation layer has a width less than a minimum resolution width of a lithography process used.

18. The semiconductor memory according to claim 16, wherein:

said at least one memory cell and said word line are formed by lithography having a minimum resolution width; and said insulation layer has a width less than said minimum resolution width.

19. The semiconductor memory according to claim 11, wherein:

said at least one memory cell is a plurality of memory cells with a plurality of bit lines;

said word line is a plurality of word lines;

said word lines are disposed substantially parallel to one another;

said bit lines are disposed substantially parallel to one another;

said word lines and said bit lines are substantially perpendicular to one another;

said trench capacitors of said memory cells are disposed laterally offset with respect to one another from one of said bit lines to another of said bit lines; and said selection transistors of said memory cells for adjacent ones of said bit lines are disposed on opposite sides of a respective one of said trench capacitors.

20. The semiconductor memory according to claim 18, wherein:

said at least one memory cell is a plurality of memory cells with a plurality of bit lines;

said word line is a plurality of word lines;

said word lines are disposed substantially parallel to one another;

said bit lines are disposed substantially parallel to one another;

said word lines and said bit lines are substantially perpendicular to one another;

said trench capacitors of said memory cells are disposed laterally offset with respect to one another from one of said bit lines to another of said bit lines; and said selection transistors of said memory cells for adjacent ones of said bit lines are disposed on opposite sides of a respective one of said trench capacitors.

* * * * *